(12) United States Patent
Choi et al.

(10) Patent No.: US 12,527,127 B2
(45) Date of Patent: Jan. 13, 2026

(54) NITRIDE SEMICONDUCTOR LIGHT EMITTING DEVICE

(71) Applicant: SAMSUNG ELECTRONICS CO., LTD., Suwon-si (KR)

(72) Inventors: Youngjin Choi, Suwon-si (KR); Donggun Lee, Suwon-si (KR); Punjae Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 355 days.

(21) Appl. No.: 18/222,223

(22) Filed: Jul. 14, 2023

(65) Prior Publication Data

US 2024/0021756 A1  Jan. 18, 2024

(30) Foreign Application Priority Data

Jul. 15, 2022 (KR) .................. 10-2022-0087469
Mar. 6, 2023 (KR) .................. 10-2023-0029395

(51) Int. Cl.
*H10H 20/825* (2025.01)
*H10H 20/812* (2025.01)
*H10H 20/815* (2025.01)

(52) U.S. Cl.
CPC ...... *H10H 20/8252* (2025.01); *H10H 20/812* (2025.01); *H10H 20/815* (2025.01)

(58) Field of Classification Search
CPC ............. H10H 20/8252; H10H 20/812; H10H 20/815; H10H 20/825
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |

(Continued)

*Primary Examiner* — Mark W Tornow
(74) *Attorney, Agent, or Firm* — Sughrue Mion, PLLC

(57) ABSTRACT

A nitride semiconductor light emitting device includes an active layer provided between P-type and N-type nitride semiconductor layers, a first strain reducing layer including first InGaN films and first GaN films alternately stacked between the N-type nitride semiconductor layer and the active layer, and a second strain reducing layer including a second InGaN film and a second GaN film alternately stacked between the first strain reducing layer and the active layer. The active layer includes an InGaN well layer, a barrier layer, an AlGaN layer between the InGaN well layer and the barrier layer, and an intermediate lattice layer between the InGaN well layer and the AlGaN layer The intermediate lattice layer including a nitride single crystal having a lattice larger than a first lattice of the InGaN well layer and smaller than a second lattice of the AlGaN layer.

20 Claims, 15 Drawing Sheets

(56) References Cited

U.S. PATENT DOCUMENTS

| | | |
|---|---|---|
| 7,372,066 B2 | 5/2008 | Sato et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,373,750 B2 | 6/2016 | Okuno |
| 9,431,575 B2 | 8/2016 | Han et al. |
| 9,768,346 B2 | 9/2017 | Han et al. |
| 10,056,524 B2 | 8/2018 | Togawa et al. |
| 10,361,341 B2 | 7/2019 | Danesh et al. |
| 11,049,995 B2 | 6/2021 | Yoo et al. |
| 2014/0054542 A1* | 2/2014 | Han .................. H10H 20/815 257/13 |
| 2014/0191192 A1* | 7/2014 | Han .................. H10H 20/824 257/13 |
| 2014/0284550 A1* | 9/2014 | Kumagai .......... H10H 20/811 257/13 |
| 2016/0126411 A1 | 5/2016 | Saito et al. |
| 2017/0092807 A1* | 3/2017 | Okuno ............. H10H 20/816 |
| 2020/0321440 A1* | 10/2020 | Bong ................ H10D 62/824 |
| 2022/0238737 A1* | 7/2022 | Kleijn .............. G02F 1/01708 |

\* cited by examiner

NITRIDE SEMICONDUCTOR LIGHT EMITTING DEVICE

CROSS-REFERENCE TO RELATED APPLICATION(S)

This application is based on and claims priority from Korean Patent Application No. 10-2023-0029395 filed on Mar. 6, 2023 and Korean Patent Application No. 10-2022-0087469 filed on Jul. 15, 2022 in the Korean Intellectual Property Office, the disclosures of which are incorporated herein by reference in their entirety.

BACKGROUND

1. Field

Example embodiments of the disclosure relate to a semiconductor light emitting device, and in particular, a nitride semiconductor light emitting device.

2. Description of Related Art

A semiconductor light emitting device may generate light of a specific wavelength by recombination of electrons and holes. A nitride semiconductor light emitting device may be configured to emit blue, green, and red light, and may be used as a light source for various lighting devices or display devices.

In the nitride semiconductor light emitting device, internal quantum efficiency may rapidly decrease as applied current increases. To address this issue, a method or a structure for increasing the internal quantum efficiency of the nitride semiconductor light emitting device has been necessary.

SUMMARY

An example embodiment of the present disclosure is to provide a nitride semiconductor light emitting device which may emit light having a long wavelength with high efficiency.

According to an aspect of the disclosure, there is provided a nitride semiconductor light emitting device, including: a P-type nitride semiconductor layer, a N-type nitride semiconductor layer; an active layer provided between the P-type nitride semiconductor layer and the N-type nitride semiconductor layer; a first strain reducing layer provided between the N-type nitride semiconductor layer and the active layer, the first strain reducing layer including a first InGaN film and a first GaN film alternately stacked; and a second strain reducing layer provided between the first strain reducing layer and the active layer, the second strain reducing layer including a second InGaN film and a second GaN film alternately stacked, wherein the active layer includes: an InGaN well layer and a barrier layer in a stacked arrangement, the barrier layer having a band gap wider than a band gap of the InGaN well layer are stacked, an AlGaN layer provided between the InGaN well layer and the barrier layer, and an intermediate lattice layer provided between the InGaN well layer and the AlGaN layer, the intermediate lattice layer including a nitride single crystal having a lattice larger than a first lattice of the InGaN well layer and smaller than a second lattice of the AlGaN layer.

According to another aspect of the disclosure, there is provided a nitride semiconductor light emitting device, including: a P-type nitride semiconductor layer; a N-type nitride semiconductor layer; an active layer provided between the P-type nitride semiconductor layer and the N-type nitride semiconductor layer; a first strain reducing layer provided between the N-type nitride semiconductor layer and the active layer, the first strain reducing layer including a first InGaN layer and a first GaN layer alternately stacked, and a second strain reducing layer provided between the first strain reducing layer and the active layer, the second strain reducing layer including a second InGaN layer and a second GaN layer alternately stacked, wherein the active layer includes a plurality of GaN barrier layers and a plurality of light emitting layers provided between the plurality of GaN barrier layers, and wherein each of the plurality of light emitting layers includes an InGaN well layer and an AlGaN layer on the InGaN well layer.

According to another aspect of the disclosure, there is provided a nitride semiconductor light emitting device, including: a P-type nitride semiconductor layer; a N-type nitride semiconductor layer; an active layer provided between the P-type nitride semiconductor layer and N-type nitride semiconductor layer; a first strain reducing layer provided between the N-type nitride semiconductor layer and the active layer, the first strain reducing layer including first InGaN layers and first GaN layers alternately stacked, and each of the first InGaN layers having a first indium composition ratio; and a second strain reducing layer provided between the first strain reducing layer and the active layer, the second strain reducing layer including second InGaN layers and second GaN layers alternately stacked, and each of the second InGaN layers having a second indium composition ratio greater than the first indium composition ratio, wherein the active layer includes a plurality of GaN barrier layers and a plurality of light emitting layers provided between the plurality of GaN barrier layers, and wherein each of the plurality of light emitting layers includes: an InGaN well layer, an AlGaN layer on the InGaN well layer, an intermediate lattice layer between the InGaN well layer and the AlGaN layer, and wherein the intermediate lattice layer includes a nitride single crystal having a lattice larger than a first lattice of the InGaN well layer and smaller than a second lattice of the AlGaN layer.

BRIEF DESCRIPTION OF THE DRAWINGS

The above and other aspects, features, and advantages of the disclosure will be more clearly understood from the following detailed description, taken in combination with the accompanying drawings, in which.

DETAILED DESCRIPTION

Hereinafter, embodiments of the disclosure will be described as follows with reference to the accompanying drawings.

Figure 1:
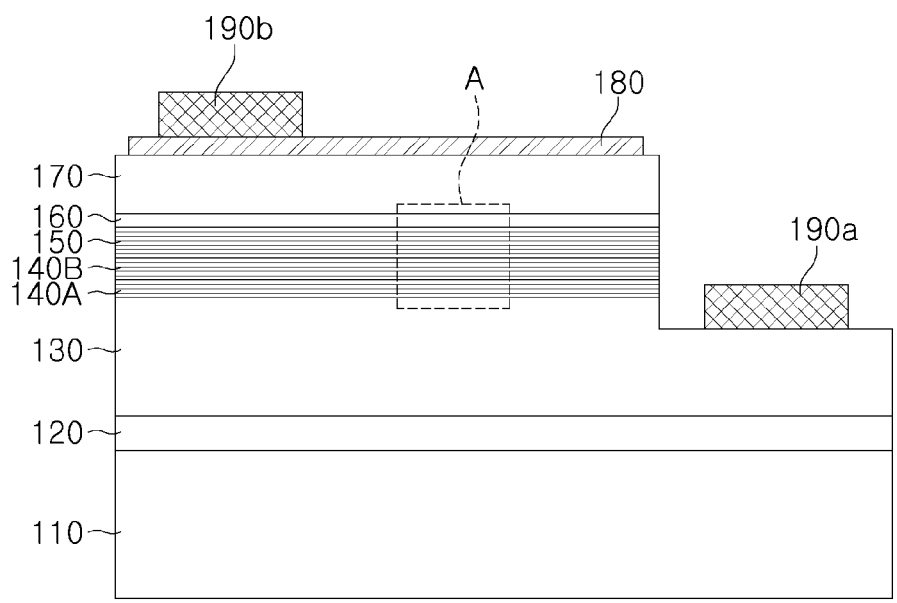
FIG. 1 is a cross-sectional diagram illustrating a nitride semiconductor light emitting device according to an example embodiment of the disclosure.
Figure 2:
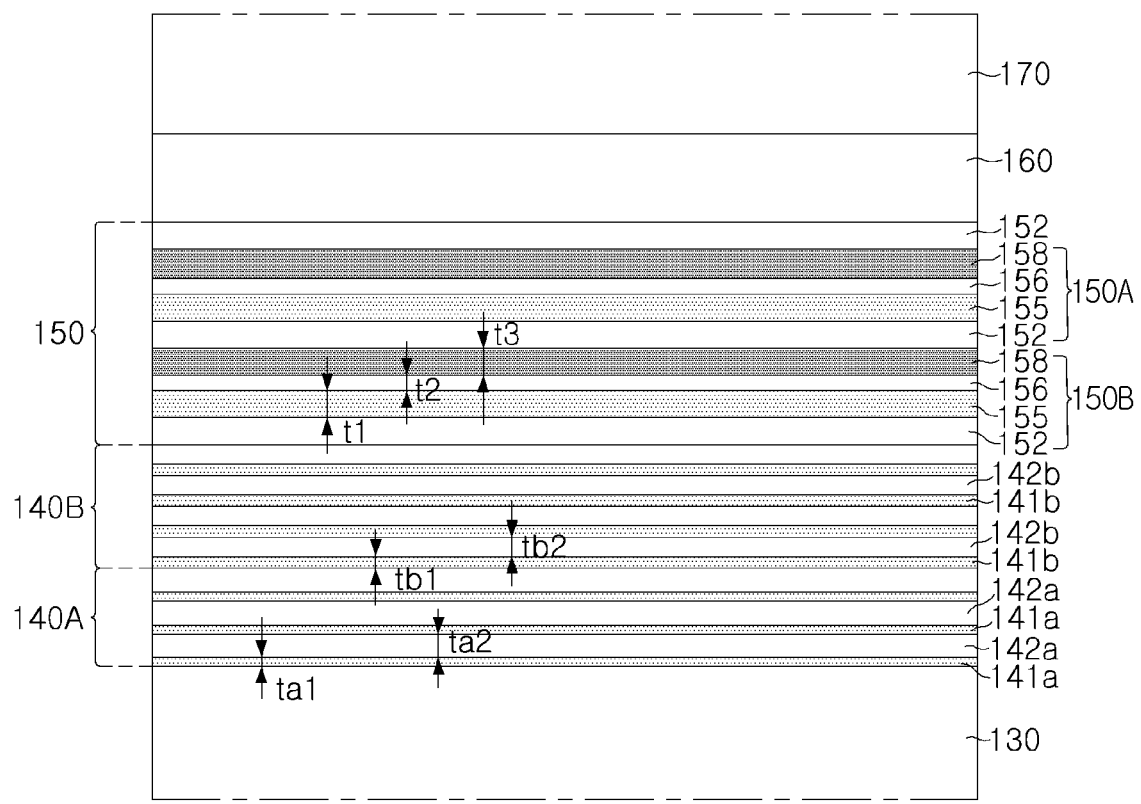
FIG. 2 is an enlarged diagram illustrating portion "A" in FIG. 1 according to an example embodiment of the disclosure.

FIG. 1 is a cross-sectional diagram illustrating a nitride semiconductor light emitting device according to an example embodiment. FIG. 2 is an enlarged diagram illustrating portion "A" in FIG. 1 according to an example embodiment.

Referring to FIG. 1, a nitride semiconductor light emitting device 100 according to the example embodiment may include a substrate 110, and a first conductivity-type nitride semiconductor layer 130, a first strain reducing layer 140A, a second strain reducing layer 140B, an active layer 150, and a second conductivity-type nitride semiconductor layer 170 provided in order on the substrate 110.

In the example embodiment, a buffer layer 120 may be provided between the substrate 110 and the first conductivity-type nitride semiconductor layer 130. The substrate 110 may be an insulating substrate such as sapphire. However, the disclosure is not limited thereto, and as such, substrate 110. The buffer layer 120 may have the following composition: $In_xAl_yGa_{1-x-y}N$ (0≤x≤1, 0≤y≤1). For example, the buffer layer 120 may include AlN, AlGaN, or InGaN. In example embodiments, the buffer layer 120 may include a plurality of layers having different compositions or may include a layer having a composition (e.g., Al or In) which may be partially gradually changed.

The first conductivity-type nitride semiconductor layer 130 may be a nitride semiconductor satisfying N-type $In_xAl_yGa_{1-x-y}N$ (0≤x<1, 0≤y<1, 0≤x+y<1), and N-type impurities may be Si. For example, the first conductivity-type nitride semiconductor layer 130 may include N-type GaN. Similarly, the second conductivity-type nitride semiconductor layer 170 may be a nitride semiconductor layer satisfying P-type $In_xAl_yGa_{1-x-y}N$ (0≤x<1, 0≤y<1, 0≤x+y<1), and P-type impurities may be Mg. For example, the second conductivity-type nitride semiconductor layer 170 may be implemented as a single layer structure. However, the disclosure is not limited thereto, and as such, the second conductivity-type nitride semiconductor layer 170 and may have a multilayer structure having different compositions in other example embodiments. For example, the second conductivity-type nitride semiconductor layer 170 may include a low-concentration P-type GaN layer and a high-concentration P-type GaN layer. In this case, a P-type electrode 180 may be formed on the high-concentration P-type GaN layer.

In the example embodiment, an electron blocking layer (electron blocking layer, EBL: 160) may be provided between the second conductivity-type nitride semiconductor layer 170 and the active layer 150. The electron blocking layer 160 may have a band gap wider than a band gap (or an energy band gap) of layers adjacent to the active layer 150, and may include a nitride single crystal layer represented by $Al_yGa_{(1-y)}N$. For example, the electrons blocking layer 160 may be configured such that the band gap may decrease as the distance increases. The grading of the band gap may be implemented by adjusting an Al composition ratio. For example, the electron blocking layer 160 may have a thickness of 5 nm to 100 nm.

Referring to FIG. 2, the active layer 150 may have a multilayer structure including a well layer 155 and a barrier layer 152 having a band gap greater than that of the well layer 155. The active layer 150 may be configured to emit light having a relatively long wavelength (e.g., 500 nm-650 nm). Light having a long wavelength may include green light (e.g., 500 nm-590 nm), orange light (e.g., 590 nm-620 nm), and red light (e.g., 620 nm-650 nm).

In the example embodiment, the well layer 155 may include a nitride single crystal represented by $In_{x1}Ga_{1-x1}N$, and an indium composition ratio x1 may be 0.15 to 0.5. For example, the thickness t1 of the well layer 155 may be in the range of 1 nm to 5 nm. The barrier layer 152 may include a nitride single crystal represented by $In_aGa_{1-a}N$ (0≤a≤0.2) or $Al_bGa_{1-b}N$ (0≤b≤0.2). For example, the barrier layer 152 may include GaN. In example embodiments, the barrier layer 152 may include GaN doped with N-type impurities such as Si. For example, the Si doping concentration may be in the range of $1\times10^{17}/cm^2$ to $1\times10^{19}/cm^2$.

The active layer 150 may have a light emitting layer having a unique structure including a well layer 155. As illustrated in FIG. 2, the active layer 150 may include a plurality of light emitting layers, and each of the plurality of light emitting layers may include an AlGaN layer 158 between the well layer 155 and the barrier layer 152, and an intermediate lattice layer 156 between the well layer 155 and the AlGaN layer 158. For example, the active layer 150 may include two light emitting layers, e.g., a first light emitting layer 150A, and a second light emitting layer 150B.

Since the well layer 155 has a relatively high indium composition ratio, indium (In) may be easily volatilized during a subsequent growth process, such that it may be difficult to implement long-wavelength light. In the example embodiment, an AlGaN layer 158 is provided on the well layer 155 and may block out-diffusion of indium from the well layer 155. Also, the intermediate lattice layer 156 may include a nitride single crystal having an intermediate lattice larger than the first lattice of the InGaN well layer 155 and smaller than the second lattice of the AlGaN layer 158. The intermediate lattice layer 156 may be included between the well layer 155 and the AlGaN layer 158 and may reduce strain and may present defects. In example embodiments, the intermediate lattice layer 156 may be smaller than the AlGaN layer 158. For example, the thickness t2 of the intermediate lattice layer 156 may be in the range of 0.5 nm to 5 nm, and the thickness t3 of the AlGaN layer 158 may be in the range of 1 nm to 20 nm.

In example embodiments, the AlGaN layer 158 may include a nitride single crystal represented by $Al_{y1}Ga_{1-y1}N$, where a first aluminum composition ratio y1 may be greater than or equal to 0.1. The first aluminum composition ratio y1 may be changed according to the indium composition ratio x1 of the well layer 155. For example, when the indium composition ratio x1 of the well layer 155 increases, the first aluminum composition ratio y1 of the AlGaN layer 158, which is relatively high, may be changed (see FIGS. 8, 9A, 9B, and 12-14).

In example embodiments, the InGaN well layer 155 may be configured to emit light having a peak wavelength of 500 nm-600 nm. In this case, the first indium composition ratio x1 of the InGaN well layer 155 may be 0.15 to 0.3, and the first aluminum composition ratio y1 of the AlGaN layer 158 may be 0.1 to 0.3.

In example embodiments, the InGaN well layer 155 may be configured to emit light having a peak wavelength of 600 nm-650 nm. In this case, the first indium composition ratio x1 of the InGaN well layer 155 may be 0.3 to 0.5, and the first aluminum composition ratio y1 of the AlGaN layer 158 may be 0.3 to 0.9.

For example, the intermediate lattice layer 156 may include AlGaN, GaN or InGaN. In example embodiments, the intermediate lattice layer 156 may include a nitride single crystal represented by $Al_{y2}Ga_{1-y2}N$, where the second aluminum composition ratio y2 may be smaller than the first aluminum composition ratio y1. In example embodiments, the intermediate lattice layer 156 may include a nitride single crystal represented by $In_{x2}Ga_{1-x2}N$, and the second indium composition ratio x2 may be smaller than the first indium composition ratio x1.

The nitride semiconductor light emitting device 100 according to the example embodiment may include a plurality of strain reducing layers between the first conductivity-type nitride semiconductor layer 130 and the active layer 150. For example, the plurality of strain reducing layers may include a first strain reducing layer 140A and a second strain reducing layer strain reducing layer 140B. Each of the plurality of strain reducing layers 140A and 140B may have a superlattice structure. However, the disclosure is not limited thereto, and as such, according to an example embodiment, one or more of the plurality of strain reducing layers may have a superlattice structure.

In the example embodiment, the first strain reducing layer 140A may be provided on a first conductivity-type nitride semiconductor layer 130, and the second strain reducing layer 140B may be provided on the first strain reducing layer 140A.

The first strain reducing layer 140A may have a superlattice structure in which first InGaN films 141a and first GaN films 142a are alternately stacked. The second strain reducing layer 140B may have a superlattice structure in which second InGaN films 141b and second GaN films 142b are alternately stacked. Here, the second InGaN film 141b may have an indium composition ratio greater than the indium composition ratio of the first InGaN film 141a. For example, the indium composition ratio of the first InGaN film 141a may be greater than 0 and less than or equal to 0.1, and the indium composition ratio of the second InGaN film 141b may be greater than or equal to 0.05 and less than or equal to 0.2.

In example embodiments, the first strain reducing layer 140A may have a film thickness condition different from that of the second strain reducing layer 140B. For example, the thickness tb1 of the second InGaN film 141b may be greater than the thickness ta1 of the first InGaN film 141a, and the thickness tb2 of the second GaN film 142b may be smaller than the thickness tb1 of the first GaN film 142a.

The nitride semiconductor light emitting device 100 according to the example embodiment may include a first electrode 190a provided on a first conductivity-type nitride semiconductor layer 130, and an ohmic contact layer 180 and a second electrode 190b provided in order on the second conductivity-type nitride semiconductor layer 170.

Referring to FIG. 1, the ohmic contact layer 180 may include a single layer or two or more layers. The ohmic contact layer 180 may be implemented in various manners depending on the chip structure. In example embodiments, when the nitride semiconductor light emitting device 100 has a flip chip structure (that is, emitting light in the direction of the substrate 110), the ohmic contact layer 180 may include a reflective metal layer. For example, the reflective metal layer may include Ag, Ni, Al, Rh, Pd, Ir, Ru, Mg, Zn, Pt, or Au. In a specific example embodiment, the ohmic contact layer 180 may further include a transmissive electrode for current distribution between the reflective metal layer and the second conductivity-type nitride semiconductor layer 170.

Alternatively, when the nitride semiconductor light emitting device 100 is configured to emit light in a direction opposite to the substrate 110, the ohmic contact layer 180 may include a transmissive electrode. The transmissive electrode may be a transparent conductive oxide layer or a nitride layer, for example, at least one selected from among indium tin oxide (ITO), zinc-doped indium tin oxide (ZITO), zinc indium oxide (ZIO), gallium indium oxide (GIO), zinc tinoxide (ZTO), fluorine-doped tin oxide (FTO), aluminium-doped zinc oxide (AZO), gallium-doped zinc oxide (GZO), $In_4Sn_3O_{12}$ and $Zn_{(1-x)}Mg_xO$(Zinc Magnesium Oxide, $0 \leq x \leq 1$). In example embodiments, ohmic contact layer 180 may include graphene.

For example, the first electrode 190a may include Ag, Ni, Al, Rh, Pd, Ir, Ru, Mg, Zn, Pt, and Au, similarly to the ohmic contact layer 180, and may include a single layer or two or more layers. In example embodiments, the first electrode 190a may include Cr/Au. The second electrode 190b may be a pad electrode provided in a partial region of the ohmic contact layer 180. For example, the second electrode 190 may include Au, Sn, or Au/Sn. A pad electrode such as Au, Sn, or Au/Sn may also be provided on the first electrode 190a.

The above-described example embodiments may be applied to semiconductor light emitting devices having various structures in addition to the nitride semiconductor light emitting device illustrated in FIG. 1. Also, as a method for manufacturing a high-efficiency semiconductor light emitting device for emitting long-wavelength light, the strain reducing layer structure and/or the active layer structure may be varied.

Figure 3:
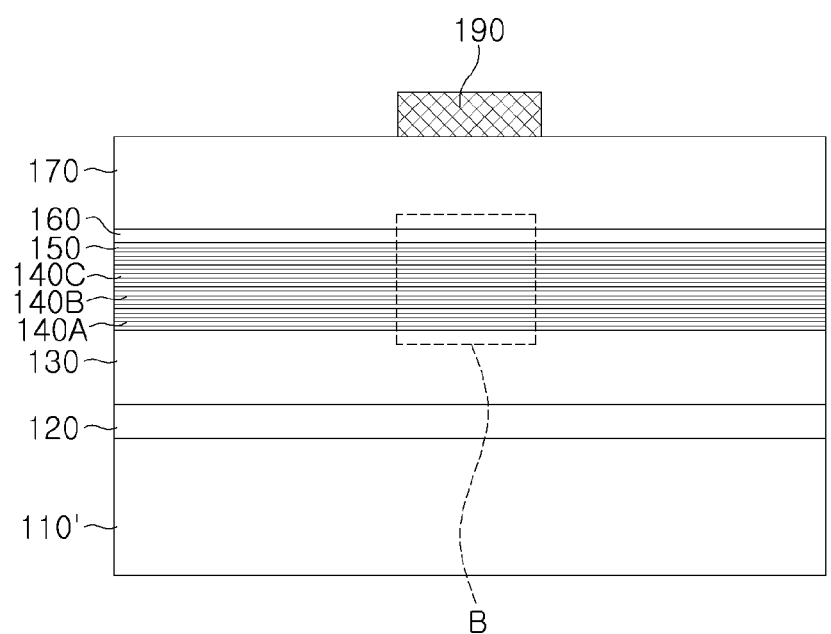
FIG. 3 is a cross-sectional diagram illustrating a nitride semiconductor light emitting device according to an example embodiment of the disclosure.
Figure 4:
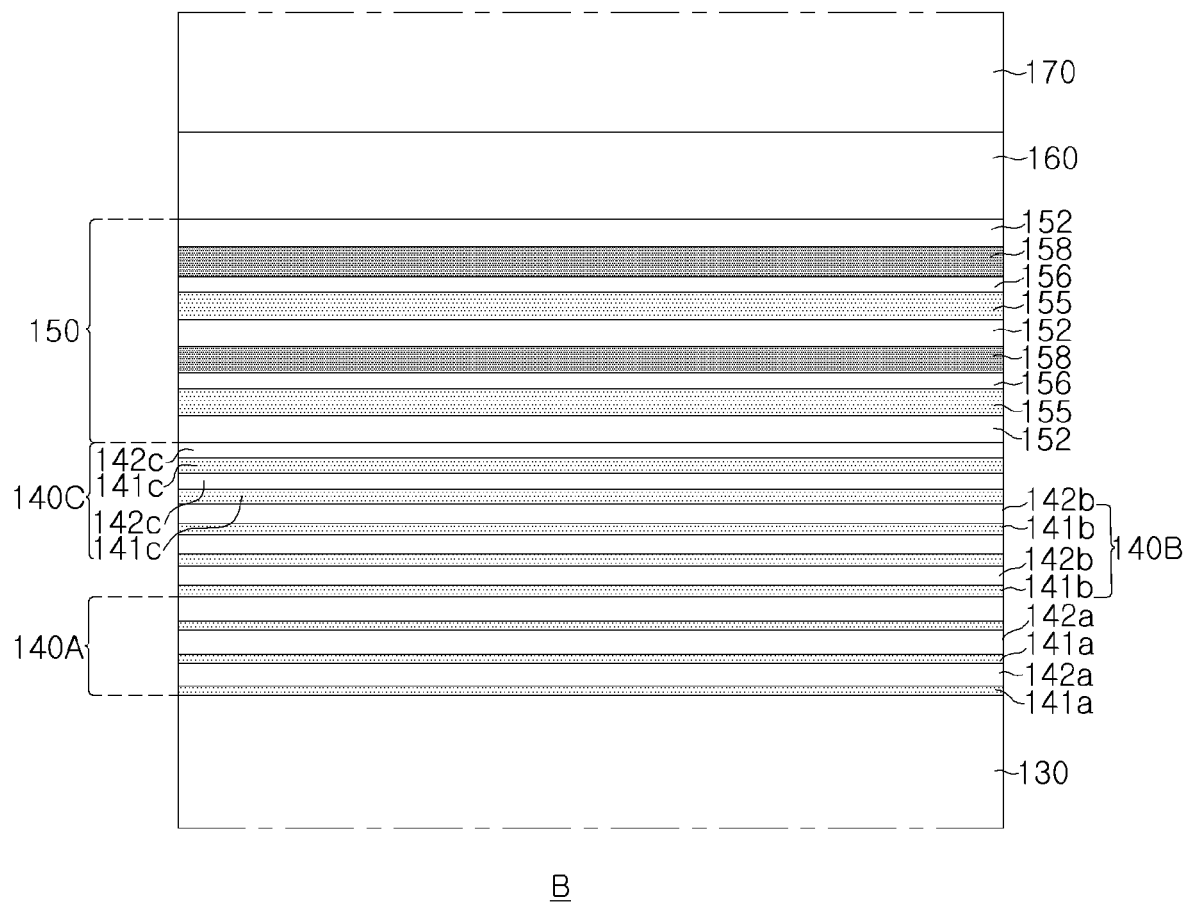
FIG. 4 is an enlarged diagram illustrating portion "B" in FIG. 3 according to an example embodiment of the disclosure.

FIG. 3 is a cross-sectional diagram illustrating a nitride semiconductor light emitting device having a vertical structure according to an example embodiment. FIG. 4 is an enlarged diagram illustrating portion "B" in FIG. 3.

Referring to FIGS. 3 and 4, the nitride semiconductor light emitting device 100A according to the example embodiment may be similar to the nitride semiconductor light emitting device 100 illustrated in FIGS. 1 and 2 other than the configuration in which a conductive substrate provided as an electrode structure on one side may be included, and the configuration in which the strain reducing structure may include three strain reducing layers. Also, components of the example embodiment may be understood by referring to descriptions of the same or similar components of the nitride semiconductor light emitting device 100 illustrated in FIGS. 1 and 2 unless otherwise indicated.

The nitride semiconductor light emitting device 100 according to the example embodiment may include a conductive substrate 110', a buffer layer 120 provided in order on the conductive substrate 110', a second conductivity-type nitride semiconductor layer 130, an active layer 150, and a first conductivity-type nitride semiconductor layer 160. The conductive substrate 110' in the example embodiment may be silicon (Si), SiC, or GaN, and may be a substrate doped with first conductivity-type impurities (N-type impurities). For example, the conductive substrate 110' may be a silicon substrate used as a growth substrate.

The conductive substrate 110' may be used as portion of a one side electrode structure. For example, the electrodes 190 provided on the conductive substrate 110' and the second conductivity-type nitride semiconductor layer 170 may be used as both electrodes for a nitride semiconductor light emitting device. Through the electrode arrangement, current flow may be realized in a vertical direction.

Referring to FIG. 4, the active layer 150 may have a multilayer structure including a well layer 155 and a barrier layer 152 having a band gap wider than that of the well layer 155. The well layer 155 may include a nitride single crystal represented by $In_{x1}Ga_{1-x1}N$, and an indium composition ratio x1 may be 0.15 to 0.5. The barrier layer 152 may include a nitride single crystal represented by $In_aGa_{1-a}N$ (0≤a≤0.2) or $Al_bGa_{1-b}N$ (0≤b≤0.2). For example, the barrier layer 152 may include GaN. In example embodiments, the barrier layer 152 may include GaN doped with N-type impurities such as Si.

The active layer 150 may include two light emitting layers, similarly to the aforementioned example embodiment, and each of the two light emitting layers may include an AlGaN layer 158 between the well layer 155 and the barrier layer 152, and an intermediate lattice layer 156 between the well layer 155 and the AlGaN layer 158.

For example, the AlGaN layer 158 may include a nitride single crystal represented by $Al_{y1}Ga_{1-y1}N$, where a first aluminum composition ratio y1 may be 0.1 or more. For example, the intermediate lattice layer 156 may include a nitride single crystal represented by $Al_{y2}Ga_{1-y2}N$, where the second aluminum composition ratio y2 may be smaller than the first aluminum composition ratio y1. In example embodiments, the intermediate lattice layer 156 may include a nitride single crystal represented by $In_{x2}Ga_{1-x2}N$, and the second indium composition ratio x2 may be smaller than the first indium composition ratio x1.

In the example embodiment, the nitride semiconductor light emitting device 100 may include three strain reducing layers 140A, 140B, and 140C provided between the first conductivity-type nitride semiconductor layer 130 and the active layer 150.

The first strain reducing layer 140A may have a superlattice structure in which first InGaN films 141a and first GaN films 142a are alternately stacked. The second strain reducing layer 140B may have a superlattice structure in which second InGaN films 141b and second GaN films 142b are alternately stacked. The third strain reducing layer 140C may have a superlattice structure in which third InGaN films 141c and first GaN films 142c are alternately stacked. For example, the first strain reducing layer 140A may include three pairs of first InGaN films 141a and the first GaN film 142a, the second strain reducing layer 140B may include three pairs of second InGaN films 141b and second GaN films 142b, and the third strain reducing layer 140C may include two pairs of third InGaN films 141c and first GaN films 142c.

In the example embodiment, the second InGaN film 141b may have an indium composition ratio greater than the indium composition ratio of the first InGaN film 141a, and the third InGaN film 141c may have an indium composition ratio greater than the indium composition ratio of the second InGaN film 141b. Also, as described above, the first to third strain reducing layers 140A, 140B, and 140C may have different film thickness conditions.

Figure 5:
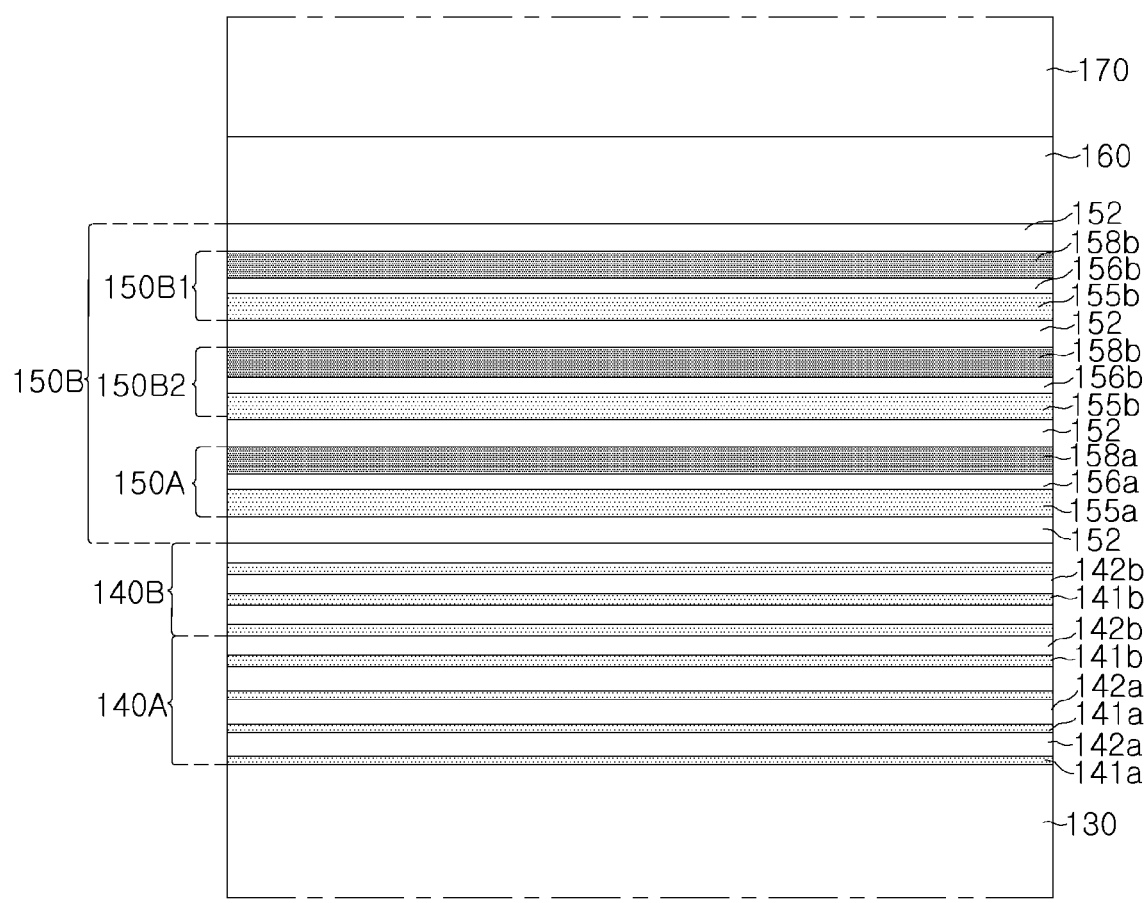
FIG. 5 is an enlarged diagram illustrating a portion of a nitride semiconductor light emitting device according to an example embodiment of the present disclosure.

FIG. 5 is an enlarged diagram illustrating a portion of a nitride semiconductor light emitting device according to another example embodiment.

Referring to FIG. 5, a nitride semiconductor light emitting device 100B according to the example embodiment may be similar to the nitride semiconductor light emitting device 100 illustrated in FIGS. 1 and 2 other than the configuration in which the nitride semiconductor light emitting device 100B may include a plurality of light emitting layers 150A, 150B1, and 150B2, and a least one of the light emitting layers 150A, 150B1, and 150B2 may be configured to emit light of different wavelengths. Also, components of the example embodiment may be understood by referring to descriptions of the same or similar components of the nitride semiconductor light emitting device 100 illustrated in FIGS. 1 and 2 unless otherwise indicated.

The active layer 150 in the example embodiment may include a plurality of barrier layers 152 and two or more light emitting layers 150A, 150B1, and 150B2 provided between the plurality of barrier layers 152, and at least one light emitting layer (150A) may be configured to emit light having a wavelength different from those of the other light emitting layers 150B1, and 150B2.

In the example embodiment, the plurality of barrier layers 152 may include four GaN barrier layers, and the plurality of light emitting layers may include a first light emitting layer 150A provided between the two barrier layers 152 therebelow and two second light emitting layers 150B1, and 150B2 provided between the three upper barrier layers 152 thereon.

The first light emitting layer 150A may include a first InGaN well layer 155a, a first AlGaN layer 158a on the first InGaN well layer 155a, and a first intermediate lattice layer 156a between the first InGaN well layer 155a and the first AlGaN layer 158a. Similarly, the second light emitting layers 150B1 and 150B2 may include a second InGaN well layer 155b, a second AlGaN layer 158b on the second InGaN well layer 155b, and a second intermediate lattice layer 156b between the second InGaN well layer 155b and the second AlGaN layer 158b.

The first light emitting layer may be configured to emit light having a first wavelength, and the second light emitting layer may be configured to emit light having a second wavelength greater than the first wavelength. For example, the first light emitting layer may be configured to emit light having a peak wavelength of 500 nm-600 nm, and the second light emitting layer may be configured to emit light having a peak wavelength of 600 nm-650 nm.

The aluminum composition ratio of the first and second AlGaN layers 155a and 155b may be changed according to the indium composition ratio of the corresponding InGaN well layer 155a and 155b. In example embodiments, when the indium composition ratio of the first and second InGaN well layers 155a and 155b increases, the aluminum composition ratio of the corresponding AlGaN layer 158a and 158b may also increase.

In the first light emitting layer 150A, the first InGaN well layer 155a may be configured to emit light having a peak wavelength of 500 nm-600 nm, the indium composition ratio of the first InGaN well layer 155a may be 0.15 to 0.3, and the aluminum composition ratio y1 of the first AlGaN layer 158a may be 0.1 to 0.3.

In the second light emitting layers 150B1 and 150B2, the second InGaN well layer 155b may be configured to emit light having a peak wavelength of 600 nm-650 nm, the indium composition ratio of the second InGaN well layer 155b may be 0.3 to 0.5, and the aluminum composition ratio of the second AlGaN layer 158b may be 0.3 to 0.9.

In example embodiments, the first and second intermediate lattice layers 156a and 156b may include AlGaN, and the aluminum composition ratio of the first and second intermediate lattice layers 156a and 156b may be smaller than the aluminum composition ratio of the first and second AlGaN layers 158a and 158b, respectively. The first and second intermediate lattice layers 156a and 156b may have different aluminum composition ratios.

In example embodiments, the first and second intermediate lattice layers 156a and 156b may include InGaN, and an indium composition ratio of the first and second intermediate lattice layers 156a and 156b may be smaller than an indium composition ratio of the first and second InGaN well layers 155a and 155b, respectively. The first and second intermediate lattice layers 156a and 156b may have different indium composition ratios.

In example embodiments, the first intermediate lattice layer 156a may include AlGaN having an aluminum composition ratio smaller than the aluminum composition ratio of the first AlGaN layer 158a, and the second intermediate lattice layer 156b may include InGaN having an indium composition ratio smaller than that of the second InGaN well layer 155b.

Hereinafter, one or more effects of the structures according to example embodiments of the disclosure will be described in detail with reference to various example embodiments of the disclosure.

Embodiment 1

According to a first example embodiment, a nitride semiconductor light emitting device as illustrated in FIGS. 1 and 2. For example, the nitride semiconductor light emitting device as illustrated in FIGS. 1 and 2 may be manufactured.

In the example embodiment, the N-type GaN layer may be formed on the sapphire substrate, and a first strain reducing layer 140A and a second strain reducing layer 140B each having a superlattice structure may be formed. The first strain reducing layer 140A may be formed by alternately laminating three pairs of $In_{0.3}Ga_{0.7}N$ films and GaN films, and the second strain reducing layer 140B may be formed by alternately laminating four pairs of $In_{0.8}Ga_{0.2}N$ films and GaN films. Thereafter, an active layer may be formed on the second strain reducing layer, and a P-type AlGaN electron blocking layer and a P-type GaN layer may be formed on the active layer.

In the example embodiment, in the active layer, two light emitting layers may be formed between three Si-doped GaN barrier layers according to the above-described conditions in the example embodiment. Specifically, as for the light emitting layer, the InGaN well layer (thickness: about 5 nm), the intermediate lattice layer (thickness: about 2 nm), and the AlGaN layer (thickness: about 10 nm) may be grown in order, and as in Table 1 below, conditions (particularly, composition ratio) of the light emitting layer may be configured differently to obtain a target wavelength.

TABLE 1

| Sample | Target emission wavelength of active layer | Indium composition ratio of well layer | Aluminum composition ratio of AlGaN layer | External quantum efficiency (@ 10 A/$cm^2$) |
|---|---|---|---|---|
| Embodiment 1A | 550 nm | 0.25 | 0.2 | 25% |
| Embodiment 1B | 580 nm | 0.30 | 0.2 | 14% |
| Embodiment 1C | 600 nm | 0.30 | 0.4 | 8% |
| Embodiment 1D | 620 nm | 0.35 | 0.6 | 6% |
| Embodiment 1E | 625 nm | 0.35 | 0.8 | 5% |

As indicated in Table 1 above, in the embodiments, a well layer having a relatively high indium composition ratio may be employed to implement long-wavelength (e.g., 550 nm or more) light. As the target emission wavelength increases, the indium composition ratio of the well layer increases, and as the indium composition ratio of the well layer increases, the aluminum composition ratio of the AlGaN layer increases.

The indium composition ratio and also the appropriate aluminum composition ratio of the AlGaN layer may be changed according to the emission wavelength. For example, when the active layer is configured to emit light having a peak wavelength of 500 nm-600 nm, the indium composition ratio of the InGaN well layer may be 0.15 to 0.3, and the aluminum composition ratio of the AlGaN layer may be 0.1 to 0.3. When the active layer is configured to emit light having a peak wavelength of 600 nm-650 nm, the indium composition ratio of the InGaN well layer may be 0.3 to 0.5, and the aluminum composition ratio of the AlGaN layer may be 0.3 to 0.9.

Also, even when the well layer was formed InGaN having the same indium composition ratio, by adjusting the aluminum composition ratio of the AlGaN layer to an appropriate range, the emitted light may be configured to have a longer wavelength. Referring to Table 1 above, when embodiment 1B and embodiment 1C are compared, the indium composition ratio of the well layer was the same as 0.30, but by increasing the aluminum composition ratio (0.2→0.4), the emission wavelength was increased from 580 nm to 600 nm. Similarly, comparing embodiment 1D and embodiment 1E, the indium composition ratio of the well layer was the same as 0.35, by increasing the aluminum composition ratio (0.6→0.8), but the emission wavelength was increased from 6200 nm to 625 nm.

Embodiment 2

Figure 6:
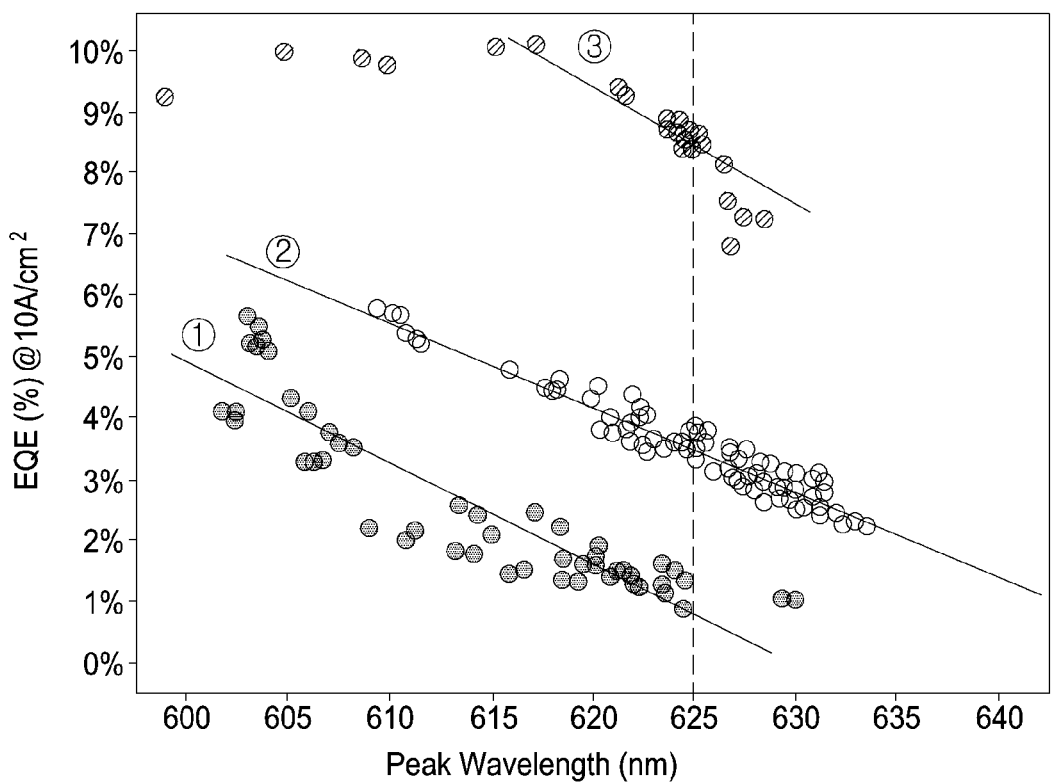
FIG. 6 is a graph illustrating internal quantum efficiency and an emission wavelength of an active layer (red light) formed under different process conditions.

According to a second example embodiment, a nitride semiconductor light emitting device may be manufactured under the same growth conditions as in embodiment 1, but the process conditions for manufacturing the active layer (particularly, the AlGaN layer) of a plurality of samples may be different. Referring to FIG. 6, in the first group of samples (①), the well layer and the intermediate lattice layer were grown, and the AlGaN layer was grown at the same temperature (about 835° C.) and pressure (about 200 mbar). In the second group of samples (②), the well layer and the intermediate lattice layer were grown, and the AlGaN layer was grown at a higher temperature (about 965° C.) and the same pressure (about 200 mbar). Also, in the samples of the third group (③), the well layer and the intermediate lattice layer were grown, and the AlGaN layer was grown at a higher temperature (about 965° C.) and a lower pressure (about 100 mbar). For each group of samples, a plurality of samples were prepared by varying the indium composition ratio of the well layer and the aluminum composition ratio of the AlGaN layer, and the emission wavelength and external quantum efficiency or the plurality of samples were measured and indicated in the graphs in FIG. 6.

Referring to FIG. 6, it is indicated that the external quantum efficiency of the samples of the second group was higher than that of the samples of the first group, and the external quantum efficiency of the samples of the third group was higher than that of the samples of the second group.

Figure 7:
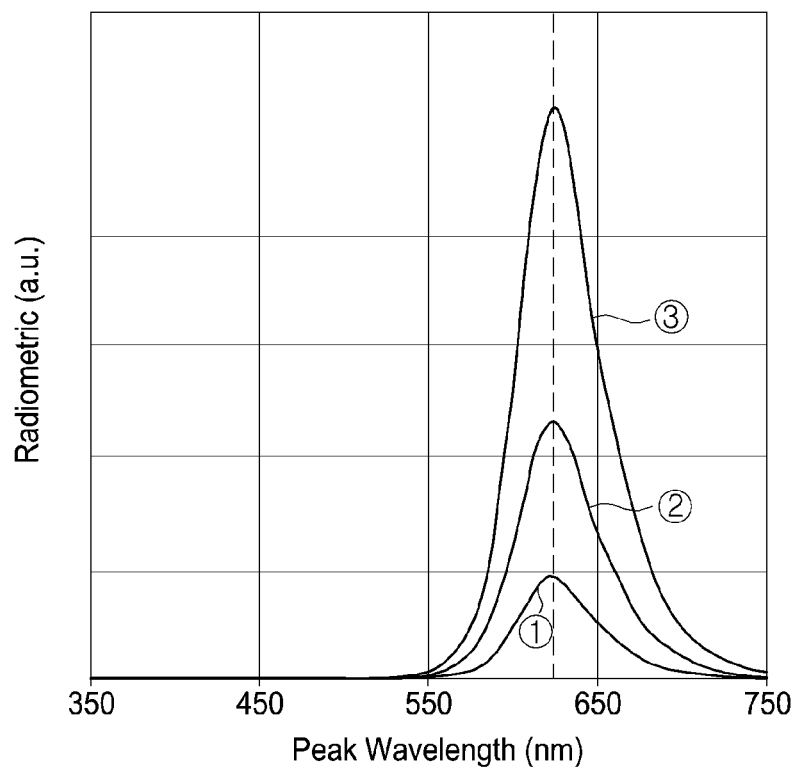
FIG. 7 is a spectrum of light (red light having a peak of 625 nm) emitted from an active layer formed under different process conditions.

FIG. 7 is an emission spectrum of each group of samples emitting light having a specific wavelength (red light having a peak of 625 nm).

Referring to FIG. 7, when the emission spectra of samples of the first to third groups emitting red light having a peak of 625 nm are compared, it is indicated that the samples of the third group had the highest peak intensity.

As such, the AlGaN layer may be manufactured with the highest efficiency when the pressure is higher than the growth temperature of the well layer (e.g., 900° C. or higher) and lower than the growth pressure of the well layer (e.g., 150 mbar).

Embodiment 3

According to a third example embodiment, a nitride semiconductor light emitting device for emitting long-wavelength light was manufactured according to the overall process conditions of the device described in embodiment 1, and the active layer was manufactured under process conditions according to the third group of samples in embodiment 2. The example embodiment was carried out to confirm the effect according to the Al composition ratio of the AlGaN layer included into the light emitting layer. When growing the well layer, the indium composition ratio (0.3 to 0.5) was configured to be maintained at the highest level, and when the AlGaN layer was formed, the aluminum composition ratio (0.4, 0.8, 0.9, and 1.0) was configured differently for each group of samples.

Figure 8:
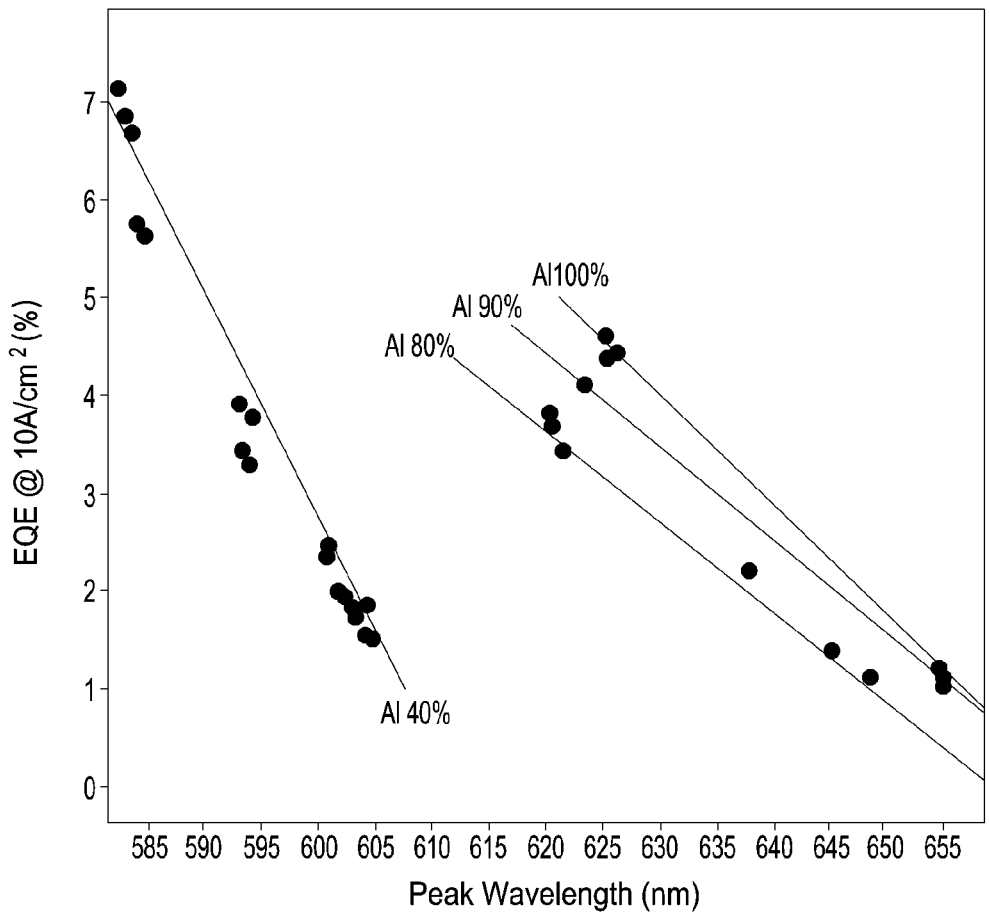
FIG. 8 is a graph illustrating changes in internal quantum efficiency and an emission wavelength depending on an Al composition ratio of an AlGaN layer when an active layer is formed.

The emission wavelength and external quantum efficiency implemented in each group of samples manufactured according to the above-described process conditions are indicated in the graphs in FIG. 8.

Referring to FIG. 8, it is confirmed that, even when a large amount of indium source was supplied while forming the well layer, as the aluminum composition ratio of the AlGaN layer increased, the emitted light of the device had a sufficiently long wavelength.

Figure 9A:
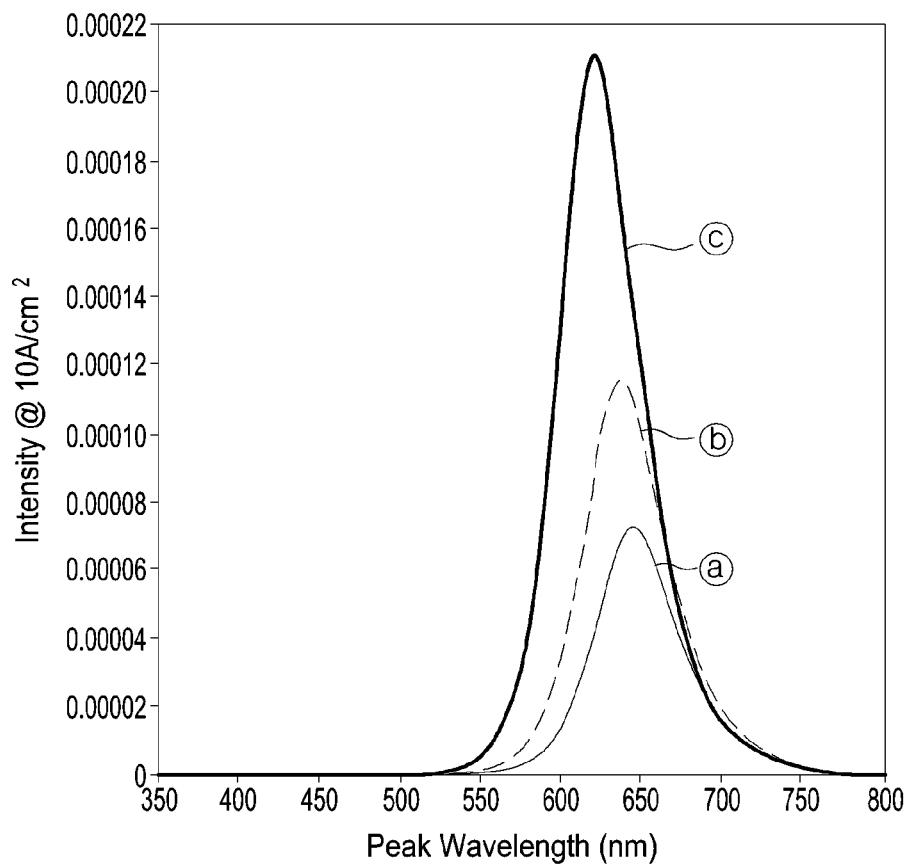
FIGS. 9A and 9B are spectrums of light emitted from active layers having different Al composition ratios (0.8 and 1.0) of an AlGaN layer, respectively.
Figure 9B:
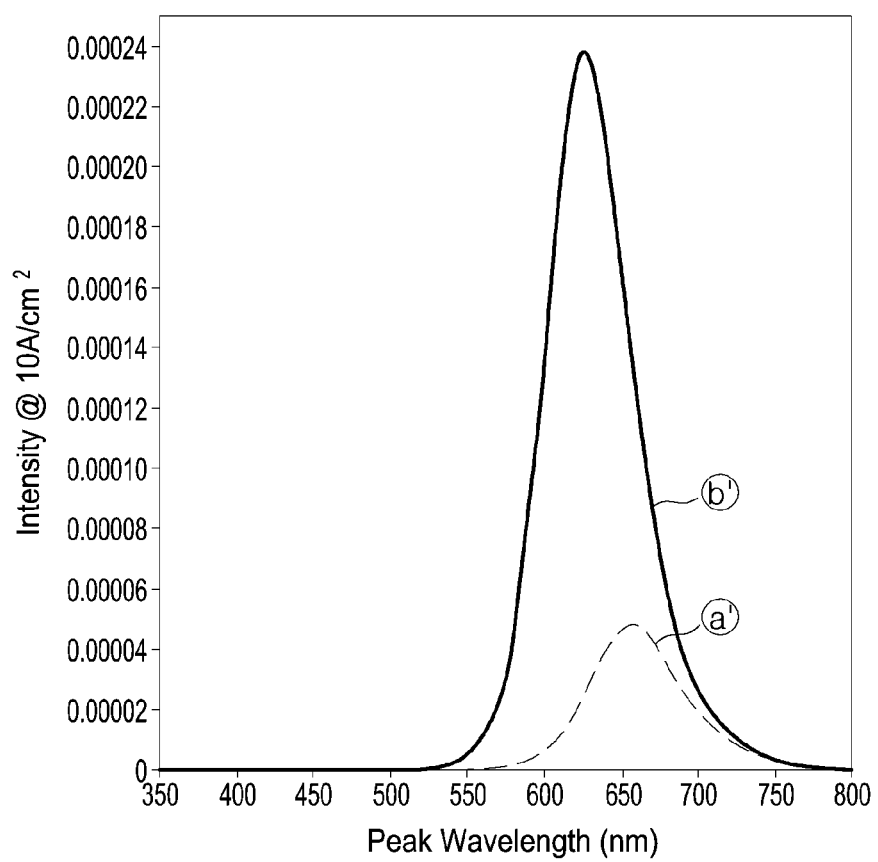

Also, the spectra of light emitted from samples having an Al composition ratio (0.8 and 1.0) of each AlGaN layer are illustrated in FIGS. 9A and 9B, respectively.

Referring to FIG. 9A, in the case of an AlGaN layer having an Al composition ratio of 0.8, three samples (ⓐ, ⓑ, ⓒ) were extracted. Sample (ⓐ) emitted light (EQE: 3.7%) having a peak wavelength of 645 nm (FWHM: 59 nm), and sample (ⓑ) emitted light (EQE: 2.2%) having a peak wavelength of 638 nm (FWHM: 60 nm), and the sample (ⓒ) emitted light (EQE: 1.4%) having a peak wavelength of 621 nm (FWHM: 59 nm).

Similarly, referring to FIG. 9B, in the case of an AlN layer having an Al composition ratio of 1.0, three samples (ⓐ', and ⓑ') were extracted. The sample (ⓐ') emitted light (EQE: 1.0%) having a peak wavelength of 655 nm (FWHM: 68 nm), and the sample (ⓑ') emitted light (EQE: 4.6%) having a peak wavelength of 625 nm (FWHM: 65 nm).

By including an AlGaN layer or an AlN layer having a high aluminum composition ratio on the well layer, a long wavelength was obtained, and also external quantum efficiency was improved under similar emission wavelength conditions (ⓒ and ⓑ').

Embodiment 4

Figure 10:
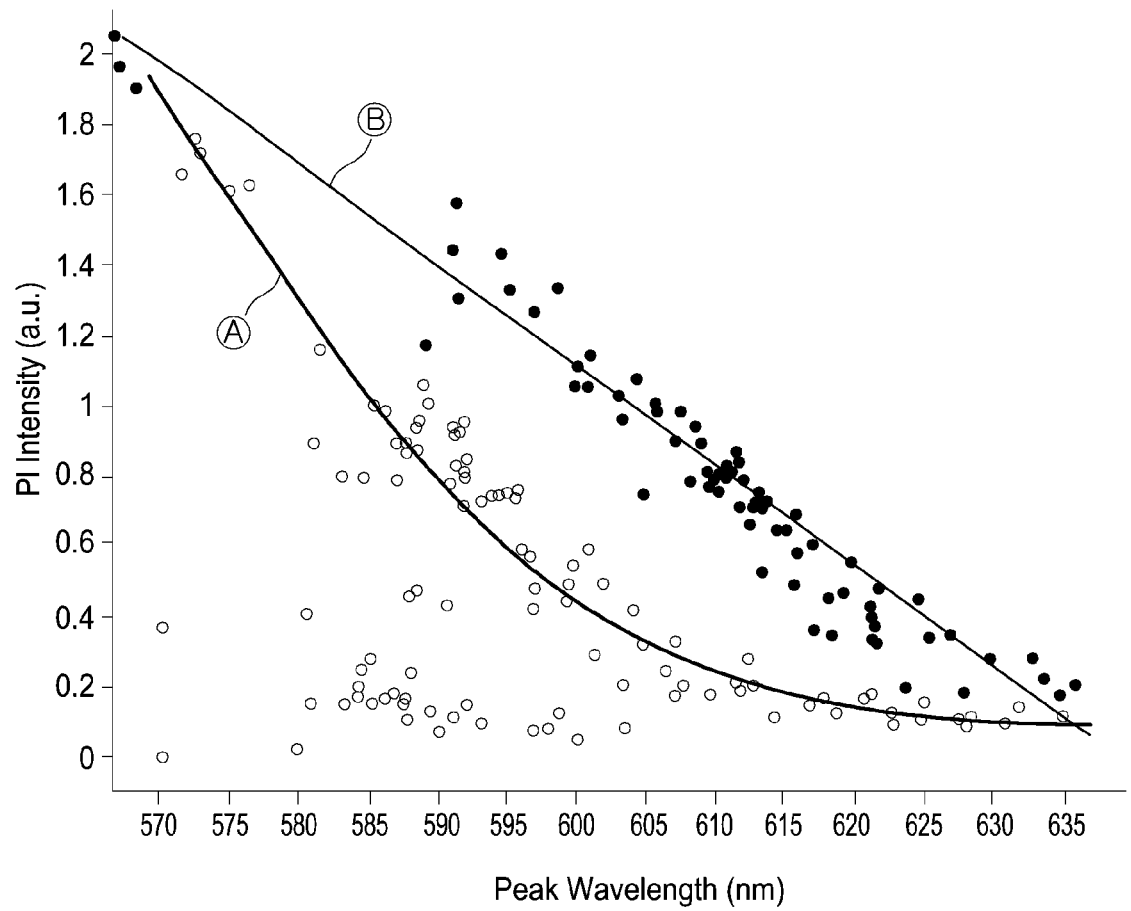
FIG. 10 is a graph illustrating internal quantum efficiency and an emission wavelength of an active layer (orange light) formed under different process conditions.

According to a fourth example embodiment, a nitride semiconductor light emitting device was manufactured under the same growth conditions as in embodiment 1, and the process conditions for manufacturing active layers (particularly, AlGaN layers) of a plurality of samples were different. The fourth example embodiment was carried out to confirm the effect according to the Al composition ratio of the AlGaN layer included into the light emitting layer. Referring to FIG. 10, in the first group of samples (A), the well layer and the intermediate lattice layer were grown, and the AlGaN layer was grown at the same temperature (about 835° C.) and pressure (about 200 mbar). In the second group of samples (B), the well layer and the intermediate lattice layer were grown, and the AlGaN layer was grown at a higher temperature (about 965° C.) and lower pressure (about 100 mbar).

Figure 11:
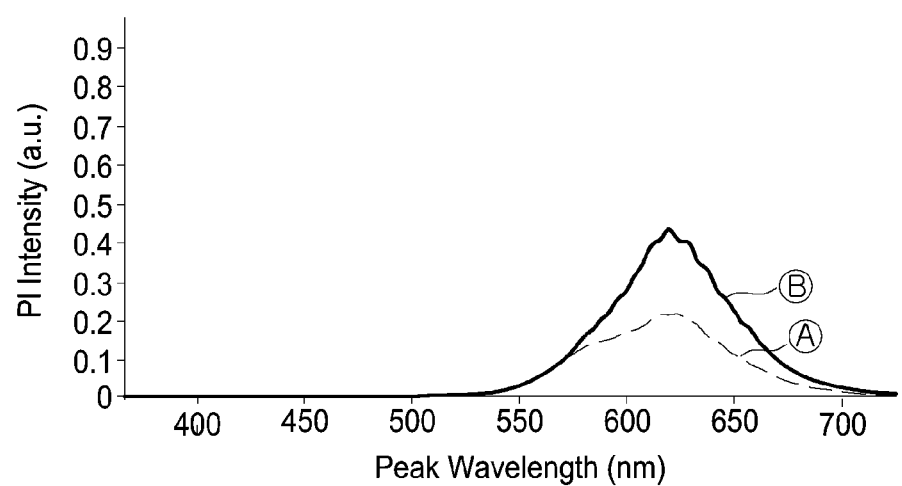
FIG. 11 is a spectrum of light (red light having a peak of 620 nm) emitted from an active layer formed under different process conditions.

As for the two groups of samples, a plurality of samples were prepared by varying the indium composition ratio of the well layer and the aluminum composition ratio of the AlGaN layer, and the peak intensity along with the emission wavelength was measured and indicated in the graphs in FIG. 10. FIG. 11 illustrates emission spectra of each group of samples emitting light having a specific wavelength (orange light having a peak of 620 nm).

Referring to FIGS. 10 and 11, it is indicated that the external quantum efficiency of the second group of samples (B) was generally higher than that of the first group of samples (A).

Figure 12:
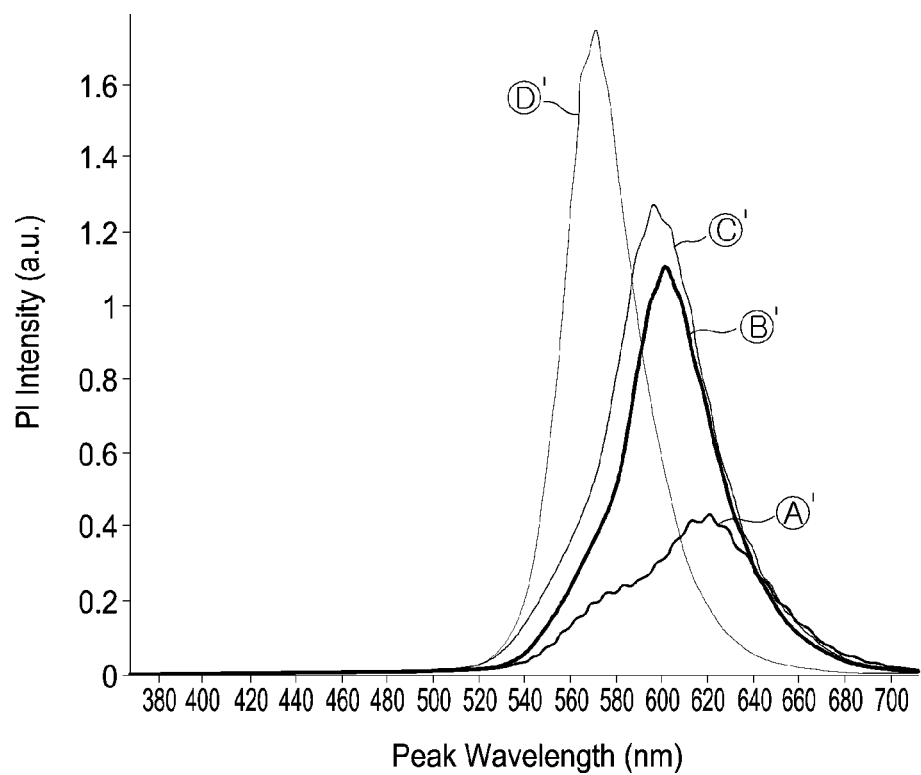
FIG. 12 is a spectrum of light emitted from various active layers (optimization of an Al composition ratio of an AlGaN layer depending on an emission wavelength)

Among the samples of the second group of the embodiments, samples having the highest intensity peak at a specific emission wavelength (A', B', C', D') were extracted and indicated as the spectra in FIG. 12. Each extracted sample was prepared under the conditions as below.

TABLE 2

| Sample | Aluminum composition ratio of AlGaN layer | Emission wavelength |
| --- | --- | --- |
| A' (Comparative example) | Without AlGaN layer | 625 nm |
| B' | 0.8 | 605 nm |
| C' | 0.6 | 595 nm |
| D' | 0.4 | 575 nm |

As illustrated in FIG. 12 and Table 2 above, when the AlGaN layer was not included, the efficiency was extremely low even when the emitted light had a long wavelength, which may be problematic. On the other hand, in the samples (B', C', and D') according to the embodiment, it was confirmed that, as the Al composition ratio of the AlGaN layer increased, it was advantageous to obtain a long wavelength even though the strength was lowered.

Embodiment 5

According to a fifth example embodiment, a nitride semiconductor light emitting device was manufactured according to embodiment 1, and a silicon substrate was used instead of the sapphire substrate. Since the silicon substrate has a higher strain on the active layer than the sapphire substrate, the efficiency may be lower, but results similar to the results obtained in the above-described embodiments were obtained.

Figure 13:
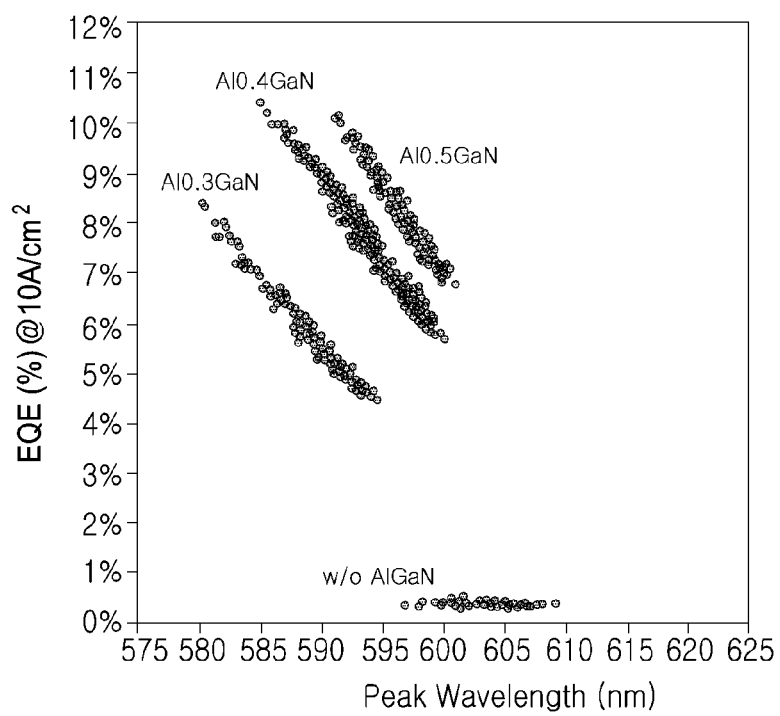
FIGS. 13 and 14 are graphs illustrating changes in internal quantum efficiency and emission wavelengths according to an Al composition ratio of an AlGaN layer.
Figure 14:
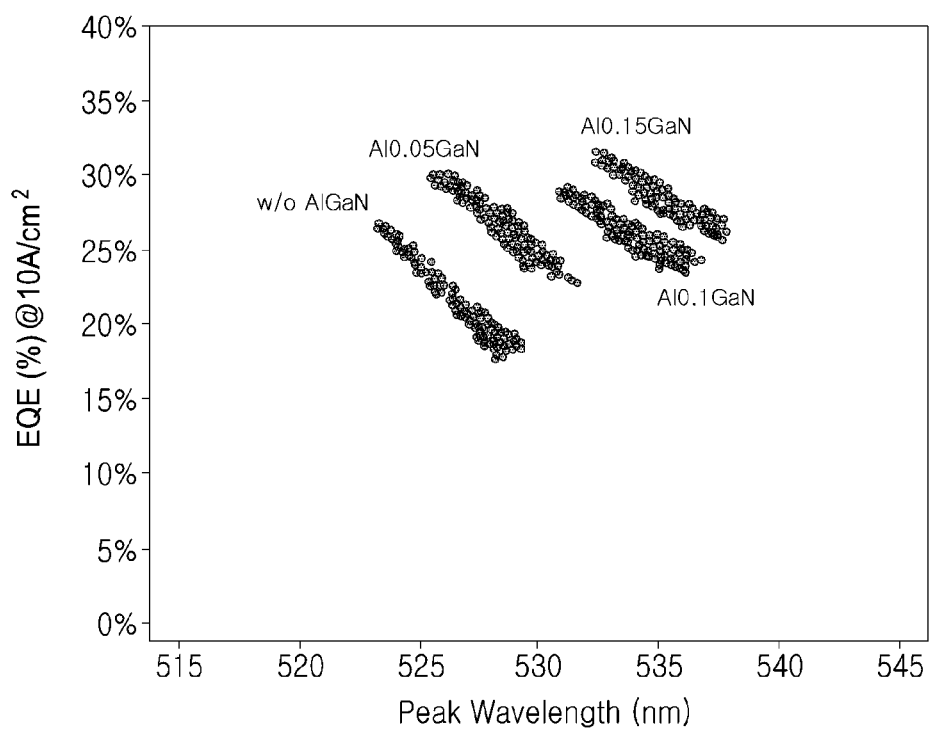

FIGS. 13 and 14 are graphs illustrating changes in internal quantum efficiency and emission wavelength according to the Al composition ratio of the AlGaN layer as results of a nitride semiconductor light emitting device manufactured on a silicon substrate.

FIG. 13 illustrates samples in which the InGaN layer was configured to emit orange light (e.g., peak wavelengths of 575 nm-600 nm). Similarly to the aforementioned embodiments, it is indicated that as the aluminum composition ratio of the AlGaN layer increased, it was advantageous to obtain a long wavelength, and relatively high efficiency was obtained under the same wavelength condition.

Similarly, FIG. 14 illustrates the sample in which the InGaN layer was configured to emit green light (e.g., peak wavelengths of 525 nm-540 nm). In the samples, it is indicated that as the aluminum composition ratio of the AlGaN layer increased, it was advantageous to obtain a long wavelength, and relatively high efficiency was obtained under the same wavelength condition.

According to the aforementioned example embodiments, by including a plurality of strain reducing layers, strain may be prevented in the active layer, and by including an AlGaN layer on the well layer, a relatively high indium (In) composition ratio of the well layer may be stably maintained. Accordingly, a nitride semiconductor light emitting device emitting long-wavelength light having relatively high internal quantum efficiency may be provided.

While the example embodiments have been illustrated and described above, it will be configured as apparent to those skilled in the art that modifications and variations could be made without departing from the scope of the disclosure as defined by the appended claims.

What is claimed is:

1. A nitride semiconductor light emitting device, comprising:
   a P-type nitride semiconductor layer,
   a N-type nitride semiconductor layer;
   an active layer provided between the P-type nitride semiconductor layer and the N-type nitride semiconductor layer;
   a first strain reducing layer provided between the N-type nitride semiconductor layer and the active layer, the first strain reducing layer comprising a first InGaN film and a first GaN film alternately stacked; and
   a second strain reducing layer provided between the first strain reducing layer and the active layer, the second strain reducing layer comprising a second InGaN film and a second GaN film alternately stacked,
   wherein the active layer comprises:
      an InGaN well layer and a barrier layer in a stacked arrangement, the barrier layer having a band gap wider than a band gap of the InGaN well layer are stacked,
      an AlGaN layer provided between the InGaN well layer and the barrier layer, and
      an intermediate lattice layer provided between the InGaN well layer and the AlGaN layer, the intermediate lattice layer comprising a nitride single crystal having a lattice larger than a first lattice of the InGaN well layer and smaller than a second lattice of the AlGaN layer.

2. The nitride semiconductor light emitting device of claim 1, wherein the InGaN well layer comprises a nitride single crystal represented by $In_{x1}Ga_{1-x1}N$, where a first indium composition ratio (x1) is 0.15 to 0.5.

3. The nitride semiconductor light emitting device of claim 2, wherein the AlGaN layer comprises a nitride single crystal represented by $Al_{y1}Ga_{1-y1}N$, where the first aluminum composition ratio (y1) is 0.1 or more.

4. The nitride semiconductor light emitting device of claim 3, wherein the nitride single crystal of the intermediate lattice layer is represented by $Al_{y2}Ga_{1-y2}N$, where a second aluminum composition ratio (y2) is smaller than the first aluminum composition ratio (y1).

5. The nitride semiconductor light emitting device of claim 3, wherein the nitride single crystal of the intermediate lattice layer is represented by $In_{x2}Ga_{1-x2}N$, where the second indium composition ratio (x2) is smaller than the first indium composition ratio (x1).

6. The nitride semiconductor light emitting device of claim 3,
   wherein the InGaN well layer is configured to emit light having a peak wavelength of 500 nm-600 nm, and
   wherein the first indium composition ratio (x1) of the InGaN well layer is 0.15 to 0.3, and the first aluminum composition ratio (y1) of the AlGaN layer is 0.1 to 0.3.

7. The nitride semiconductor light emitting device of claim 3,
   wherein the InGaN well layer is configured to emit light having a peak wavelength of 600 nm-650 nm, and
   wherein a first indium composition ratio (x1) of the InGaN well layer is 0.3 to 0.5, and a first aluminum composition ratio (y1) of the AlGaN layer is 0.3 to 0.9.

8. The nitride semiconductor light emitting device of claim 1, wherein the InGaN well layer is configured to emit light having a peak wavelength of 500 nm to 650 nm.

9. The nitride semiconductor light emitting device of claim 1,
   wherein the InGaN well layer has a thickness of 1 nm to 5 nm, and
   wherein the AlGaN layer has a thickness of 1 nm to 20 nm.

10. The nitride semiconductor light emitting device of claim 9, wherein the intermediate lattice layer has a thickness of 0.5 nm to 5 nm.

11. The nitride semiconductor light emitting device of claim 1, wherein an indium composition ratio of the second InGaN film is greater than an indium composition ratio of the first InGaN film.

12. The nitride semiconductor light emitting device of claim 1, wherein the second InGaN film has a thickness greater than a thickness of the first InGaN film.

13. The nitride semiconductor light emitting device of claim 1, wherein the second GaN film has a thickness smaller than a thickness of the first GaN film.

14. The nitride semiconductor light emitting device of claim 13, further comprising:
   a third strain reducing layer provided between the second strain reducing layer and the active layer, the third strain reducing layer comprising a third InGaN film and a third GaN film alternately stacked,
   wherein an indium composition ratio of the third InGaN film is greater than an indium composition ratio of the second InGaN film.

15. A nitride semiconductor light emitting device, comprising:
   a P-type nitride semiconductor layer;
   a N-type nitride semiconductor layer;

an active layer provided between the P-type nitride semiconductor layer and the N-type nitride semiconductor layer;

a first strain reducing layer provided between the N-type nitride semiconductor layer and the active layer, the first strain reducing layer comprising a first InGaN layer and a first GaN layer alternately stacked; and a second strain reducing layer provided between the first strain reducing layer and the active layer, the second strain reducing layer comprising a second InGaN layer and a second GaN layer alternately stacked, wherein the active layer comprises a plurality of GaN barrier layers and a plurality of light emitting layers provided between the plurality of GaN barrier layers, and wherein each of the plurality of light emitting layers comprises an InGaN well layer and an AlGaN layer on the InGaN well layer.

16. The nitride semiconductor light emitting device of claim 15, wherein each of the plurality of light emitting layers is configured to emit light having a peak wavelength of 500 nm to 650 nm.

17. The nitride semiconductor light emitting device of claim 15, wherein the plurality of light emitting layers comprise a first light emitting layer configured to emit light having a first wavelength and a second light emitting layer configured to emit light having a second wavelength greater than the first wavelength.

18. The nitride semiconductor light emitting device of claim 17, wherein the first light emitting layer is configured to emit light having a peak wavelength of 500 nm to 600 nm, and the second light emitting layer is configured to emit light having a peak wavelength of 600 nm to 650 nm.

19. The nitride semiconductor light emitting device of claim 17, wherein the AlGaN layer of the first light emitting layer has a first aluminum composition ratio, and the AlGaN layer of the second light emitting layer has a second aluminum composition ratio greater than the first aluminum composition ratio.

20. A nitride semiconductor light emitting device, comprising:

a P-type nitride semiconductor layer;

a N-type nitride semiconductor layer;

an active layer provided between the P-type nitride semiconductor layer and N-type nitride semiconductor layer;

a first strain reducing layer provided between the N-type nitride semiconductor layer and the active layer, the first strain reducing layer comprising first InGaN layers and first GaN layers alternately stacked, and each of the first InGaN layers having a first indium composition ratio; and, a second strain reducing layer provided between the first strain reducing layer and the active layer, the second strain reducing layer comprising second InGaN layers and second GaN layers alternately stacked, and each of the second InGaN layers having a second indium composition ratio greater than the first indium composition ratio, wherein the active layer comprises a plurality of GaN barrier layers and a plurality of light emitting layers provided between the plurality of GaN barrier layers, and wherein each of the plurality of light emitting layers comprises:

an InGaN well layer, an AlGaN layer on the InGaN well layer, an intermediate lattice layer between the InGaN well layer and the AlGaN layer, the intermediate lattice layer comprising a nitride single crystal having a lattice larger than a first lattice of the InGaN well layer and smaller than a second lattice of the AlGaN layer.

* * * * *